United States Patent [19]
Yuri et al.

[11] Patent Number: 5,928,421
[45] Date of Patent: Jul. 27, 1999

[54] METHOD OF FORMING GALLIUM NITRIDE CRYSTAL

[75] Inventors: Masaaki Yuri, Kyoto, Japan; Tetsuzo Ueda, Menlo Park; Takaaki Baba, Los Altos, both of Calif.

[73] Assignee: Matsushita Electronics Corporation, Osaka, Japan

[21] Appl. No.: 08/917,616

[22] Filed: Aug. 26, 1997

[30] Foreign Application Priority Data

Aug. 27, 1996 [JP] Japan ................................ 8-224899

[51] Int. Cl.⁶ .................................................. C30B 25/04
[52] U.S. Cl. ............................... 117/97; 117/90; 117/94
[58] Field of Search ................................ 117/84, 90, 94, 117/97, 104; 438/479, 507

[56] References Cited

U.S. PATENT DOCUMENTS

| 5,637,527 | 6/1997 | Porowski et al. | 117/89 |
| 5,667,586 | 9/1997 | Ek et al. | 117/84 |
| 5,759,908 | 6/1998 | Steckl et al. | 438/479 |

*Primary Examiner*—Felisa Hiteshew
*Attorney, Agent, or Firm*—Stevens, Davis, Miller & Mosher, L.L.P.

[57] ABSTRACT

To reduce a dislocation density within a gallium nitride crystal and make cleaving possible, after forming a thin film of silicon carbide and a first gallium nitride crystal on a silicon substrate, only the silicon substrate is removed in an acid solution such as hydrofluoric acid and nitric acid as they are mixed. Following this, a second gallium nitride crystal is formed on the remaining thin film of silicon carbide and the first gallium nitride crystal.

28 Claims, 5 Drawing Sheets

PRIOR ART

METHOD OF FORMING GALLIUM NITRIDE CRYSTAL

BACKGROUND OF THE INVENTION

1. Field of the Invention

The present invention relates to a method of forming a gallium nitride crystal which can be used for a semiconductor laser having a short wavelength, a transistor which operates at a high speed, etc.

2. Description of the Related Art

A semiconductor laser is widely used as a light source for reading of and writing in an optical disk. Since a recordable amount of information per unit surface area of an optical disk is inversely proportional to a square of a wavelength of a light source, in order to realize high-density recording, it is essential to shorten the wavelength of the light source. Gallium nitride is a direct transition semiconductor which has a forbidden band of 3.4 eV width, and can create a mixed crystal of aluminum nitride and indium nitride. This makes it easy to form a double heterostructure which is necessary to realize a semiconductor laser, and therefore, much expectation is placed on a possible use of gallium nitride as a laser material which has a short wavelength of around 400 nm.

In a conventional method of forming a gallium nitride crystal, sapphire is used for a substrate. A thin film of aluminum nitride or gallium nitride is formed on a sapphire substrate, and a gallium nitride crystal is formed at a higher temperature than a temperature at which the thin film of aluminum nitride or gallium nitride grows.

Now, the conventional method of forming a gallium nitride crystal will be described.

Figure 5:
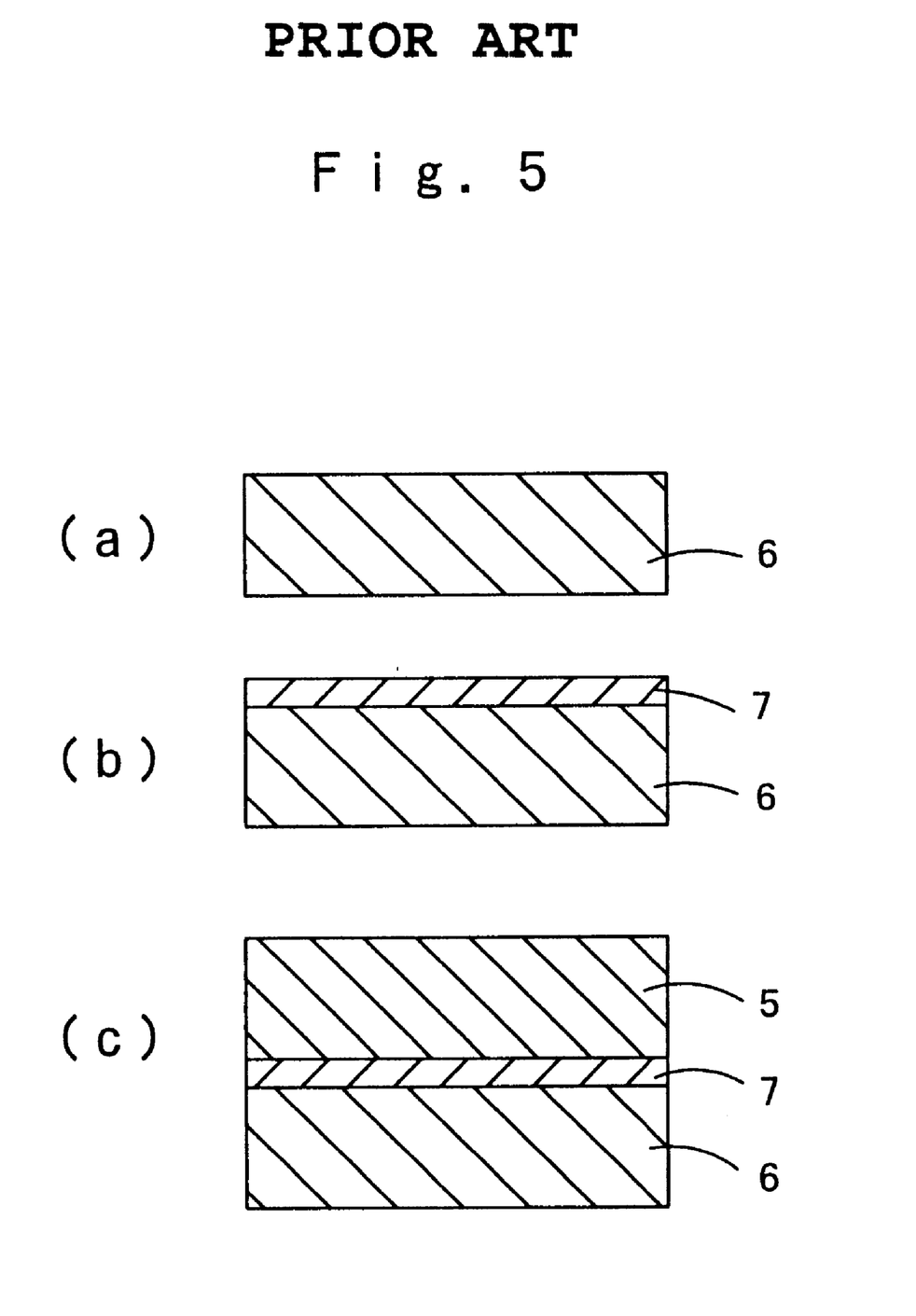
FIGS. 5A to 5C are cross sectional views showing steps in sequence and describing a conventional method of forming a gallium nitride crystal.

FIGS. 5A to 5C are cross sectional views showing steps in sequence and describing the conventional method of forming a gallium nitride crystal. In FIGS. 5A to 5C, denoted at 5 is a gallium nitride crystal, denoted at 6 is a substrate of sapphire, for example, and denoted at 7 is a thin film of aluminum nitride, for example.

In this method of forming a gallium nitride crystal, as shown in FIGS. 5A and 5B, by reacting trimethyl aluminum and ammonia at a growth temperature of 550° C., for instance, the aluminum nitride thin film 7 is formed to have a thickness of about 300 Å on the sapphire substrate 6. Following this, the substrate is heated to a temperature of 1,050° C., for example, to react trimethyl gallium and ammonia, whereby the gallium nitride crystal 5 is formed into a thickness of 4 μm as shown in FIG. 5C.

However, in the conventional method of forming a gallium nitride crystal described above, lattice constants along the a-axis of a hexagonal crystal of the sapphire substrate, gallium nitride and aluminum nitride are 4.758 Å, 3.189 Å and 3.111 Å, respectively. Thus, the lattice constants of the sapphire substrate, the gallium nitride and the aluminum nitride are largely different from each other. Because of this, a stress is created between the sapphire substrate and growing layers of the gallium nitride and the aluminum nitride during growth, which in turn creates a dislocation or a crack in the growing layers.

In the example of the conventional method above, a density of dislocation within the gallium nitride crystal is about $10^9$ cm$^{-2}$. In general, it is difficult to obtain a gallium nitride crystal which has a smaller density of dislocation than this.

Further, since a cleavage plane orientation of the sapphire substrate and a cleavage plane orientation of gallium nitride are different by 30 degrees, it is not possible to obtain an excellent cleavage plane of gallium nitride. This forces use of other methods except for cleaving, such as dry etching, for obtaining an oscillator which is necessary to realize a semiconductor laser apparatus. Thus, there are a number of difficulties in obtaining an excellent oscillator, in reality.

SUMMARY OF THE INVENTION

A first object of the present invention is to provide a method of forming a gallium nitride crystal in which cleaving is easy.

A second object of the present invention is to provide a method of forming a gallium nitride crystal in which it is possible to lower a dislocation density within the gallium nitride crystal.

In methods of forming a gallium nitride crystal according to the present invention, a semiconductor thin film which has a different lattice constant at least from a semiconductor substrate is formed on the semiconductor substrate, and following this, a gallium nitride crystal is formed on the semiconductor thin film after removing the semiconductor substrate, or the semiconductor substrate is removed after forming a gallium nitride crystal on the semiconductor thin film.

In the former method, a dislocation density within the gallium nitride crystal is largely lowered, and cleaving at a specific crystal plane is easy. In the latter method, it is possible to cleave at a specific crystal plane in an easy manner.

Now, the present invention will be described specifically.

In a method of forming a gallium nitride crystal according to a first aspect of the present invention, a semiconductor thin film and a first gallium nitride crystal, both having a different lattice constant from a semiconductor substrate, is formed on the semiconductor substrate, and a second gallium nitride crystal is formed on the first gallium nitride crystal after removing the semiconductor substrate.

In such a construction of the method, crystal dislocations and cracks due to a stress between the semiconductor thin film and the first and the second gallium nitride crystals are created within the semiconductor thin film but not within gallium nitride. As a result, a dislocation density within the second gallium nitride crystal is lowered.

Further, since it is possible to form the gallium nitride crystal into a film thickness which is sufficiently larger than that of the semiconductor film, cleaving of the gallium nitride crystal at a specific crystal plane, such as a {110} plane of a cubic crystal, is possible, and therefore, it is possible to realize a semiconductor laser apparatus in which a cleavage plane serves as an end surface of an oscillator.

In a method of forming a gallium nitride crystal according to a second aspect of the present invention, after forming a semiconductor thin film which has a different lattice constant from a semiconductor substrate is formed on the semiconductor substrate, the semiconductor substrate is removed and a gallium nitride crystal is thereafter formed on the semiconductor thin film.

In such a construction of the method, crystal dislocations and cracks due to a stress between the semiconductor thin film and the gallium nitride crystal are created within the semiconductor thin film but not within the gallium nitride crystal. As a result, a dislocation density within the gallium nitride crystal is lowered.

Further, since it is possible to form the gallium nitride crystal into a film thickness which is sufficiently larger than that of the semiconductor film, cleaving of the gallium nitride crystal at a specific crystal plane, such as a {110} plane of a cubic crystal, is possible, and therefore, it is possible to realize a semiconductor laser apparatus in which a cleavage plane serves as an end surface of an oscillator.

In a method of forming a gallium nitride crystal according to a third aspect of the present invention, after forming a second semiconductor thin film and a gallium nitride crystal, both having a different lattice constant from a semiconductor substrate, on the semiconductor substrate in this order, the semiconductor substrate is removed.

In such a construction of the method, since it is possible to form the gallium nitride crystal into a film thickness which is sufficiently larger than that of the semiconductor film, cleaving of the gallium nitride crystal at a specific crystal plane, such as a {110} plane of a cubic crystal, is possible.

In a method of forming a gallium nitride crystal according to a fourth aspect of the present invention, a thin film of silicon carbide and a first gallium nitride crystal are formed on a silicon substrate in this order, and after removing the silicon substrate, a second gallium nitride crystal is formed on the first gallium nitride crystal.

In such a construction of the method, a lattice constant of a cubic crystal of the silicon carbide is 4.36 Å, a lattice constant of the gallium nitride is 4.49 Å and a lattice constant of the silicon is 5.43 Å. Thus, since a difference between the lattice constant of the silicon carbide and the lattice constant of the gallium nitride is smaller than a difference between the lattice constant of the silicon and the lattice constant of the gallium nitride, when a gallium nitride crystal is formed on the silicon carbide thin film, a stress between the layer of the silicon carbide thin film and the layer of the gallium nitride crystal is small. In addition, crystal dislocations and cracks due to the stress between the silicon carbide thin film and the gallium nitride crystal are created within the silicon carbide thin film but not within the gallium nitride crystal. This reduces a dislocation density within the gallium nitride crystal.

Further, since it is possible to form the gallium nitride crystal into a film thickness which is sufficiently larger than that of the semiconductor film, cleaving of the gallium nitride crystal at a specific crystal plane of the gallium nitride crystal is possible, and therefore, it is possible to realize a semiconductor laser apparatus in which a cleavage plane serves as an end surface of an oscillator.

In a method of forming a gallium nitride crystal according to a fifth aspect of the present invention, after forming a thin film of silicon carbide on a silicon substrate, the silicon substrate is removed, and a gallium nitride crystal is formed on the silicon carbide thin film.

In such a construction of the method, since a difference between a lattice constant of the silicon carbide and a lattice constant of the gallium nitride is smaller than a difference between a lattice constant of the silicon and the lattice constant of the gallium nitride, when the gallium nitride crystal is formed on the silicon carbide thin film, a stress between the layer of the silicon carbide thin film and the layer of the gallium nitride crystal is small. In addition, crystal dislocations and cracks due to the stress between the silicon carbide thin film and the gallium nitride crystal are created within the silicon carbide thin film but not within the gallium nitride crystal. This reduces a dislocation density within the gallium nitride crystal.

Further, since it is possible to form the gallium nitride crystal into a film thickness which is sufficiently larger than that of the semiconductor film, cleaving of the gallium nitride crystal at a specific crystal plane of the gallium nitride crystal is possible, and therefore, it is possible to realize a semiconductor laser apparatus in which a cleavage plane serves as an end surface of an oscillator.

In a method of forming a gallium nitride crystal according to a sixth aspect of the present invention, a thin film of silicon carbide and a gallium nitride crystal are formed on a silicon substrate in this order, and the silicon substrate is removed.

In such a construction of the method, since it is possible to form the gallium nitride crystal into a film thickness, which is sufficiently larger than that of the semiconductor film, cleaving of the gallium nitride crystal at a specific crystal plane of the gallium nitride crystal, is possible.

In a method of forming a gallium nitride crystal according to a seventh aspect of the present invention, the silicon substrate is heated in a hydrocarbon atmosphere to thereby form the silicon carbide thin film in the fourth to the sixth aspects.

In such a construction of the method, it is possible to form the silicon carbide thin film, which serves as a base for growing the gallium nitride crystal, with an excellent reproducibility.

As described above, in the methods of forming a gallium nitride crystal according to the present invention, a semiconductor thin film is formed on a semiconductor substrate, and during growth of a gallium nitride crystal on the semiconductor thin film, the semiconductor substrate is removed before forming the gallium nitride crystal, thereby obtaining an excellent effect that a dislocation density within the gallium nitride crystal is low and it is possible to form a gallium nitride crystal which can be cleaved. In addition, by removing the semiconductor substrate after forming the gallium nitride crystal, an excellent effect is obtained that it is possible to form a gallium nitride crystal which can be cleaved.

DESCRIPTION OF THE PREFERRED EMBODIMENTS

First Preferred Embodiment

FIGS. 1A to 1E are cross sectional views showing steps in sequence and describing a method of forming a gallium nitride crystal according to a first preferred embodiment of the present invention. In FIGS. 1A to 1E, denoted at 1 is a silicon substrate, denoted at 2 is a thin film of silicon carbide, denoted at 3 is a first gallium nitride crystal, and denoted at 4 is a second gallium nitride crystal.

A lattice constant of a cubic crystal of the silicon carbide is 4.36 Å, a lattice constant of the gallium nitride is 4.49 Å and a lattice constant of the silicon is 5.43 Å. Thus, a difference between the lattice constant of the silicon carbide and the lattice constant of the gallium nitride is smaller than a difference between the lattice constant of the silicon and the lattice constant of the gallium nitride.

Figure 1:
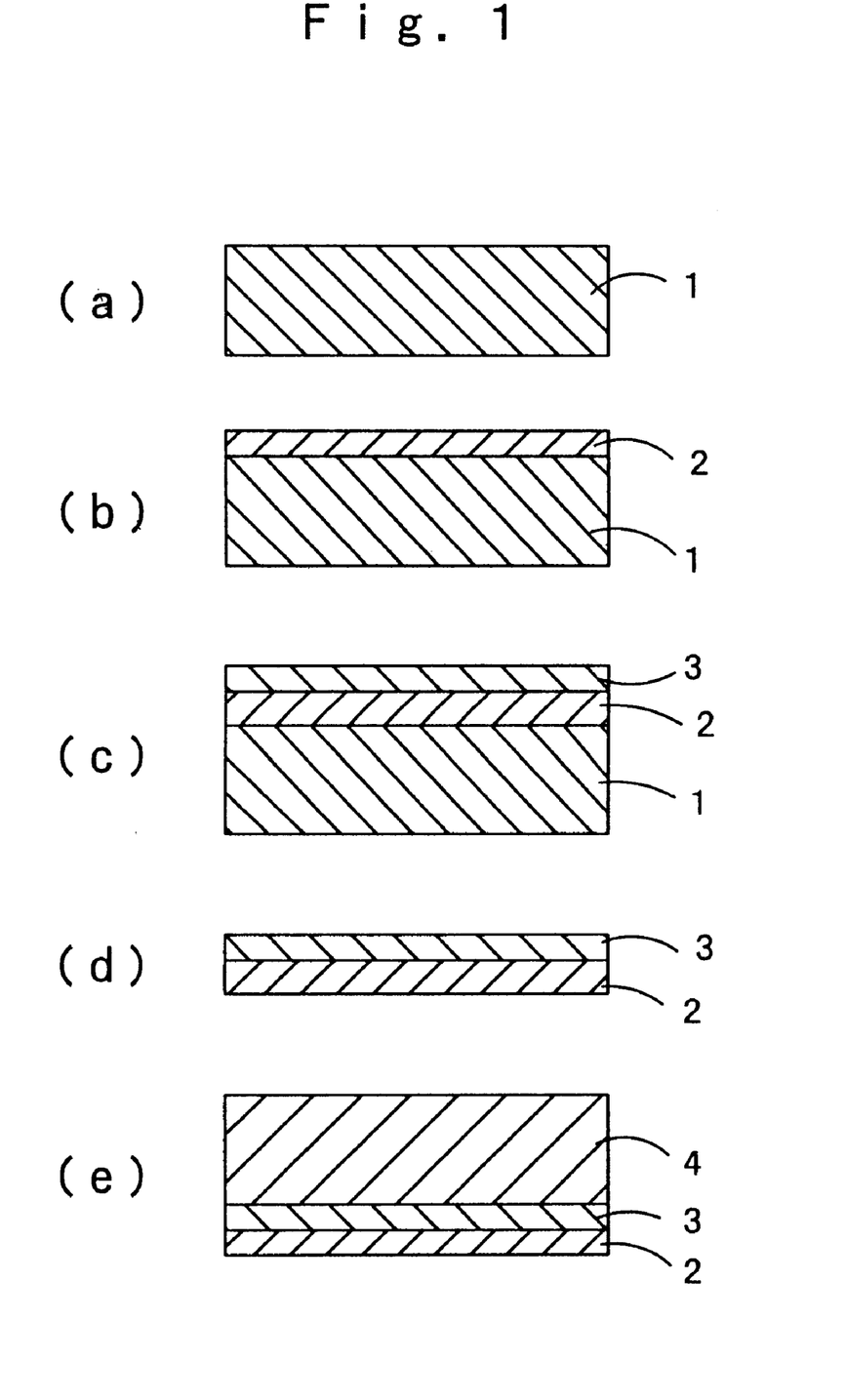
FIGS. 1A to 1E are cross sectional views showing steps in sequence and describing a method of forming a gallium nitride crystal according to a first preferred embodiment of the present invention.

In this method of forming a gallium nitride crystal, as shown in FIGS. 1A and 1B, the silicon carbide thin film 2 is formed into a thickness of about 500 Å on the silicon substrate 1. Following this, as shown in FIG. 1C, the first gallium nitride crystal 3 is formed into a thickness of about 1 $\mu$m on the silicon carbide thin film 2. The silicon substrate 1, the silicon carbide thin film 2 and the first gallium nitride crystal 3 are thereafter immersed in an acid solution which is obtained by mixing hydrofluoric acid (HF) and nitric acid ($HNO_3$) as shown in FIG. 1D, thereby removing only the silicon substrate 1. Further, as shown in FIG. 1E, the second gallium nitride crystal 4 is formed into a thickness of about 30 $\mu$m on the first gallium nitride crystal 3.

Thus, in the first preferred embodiment, by removing the silicon substrate 1, during growth of the second gallium nitride crystal 4, crystal dislocations and cracks due to a stress between the two layers are created within the silicon carbide thin film 2 but not within the second gallium nitride crystal 4, so that a dislocation density within the gallium nitride crystal is lowered. Further, as the lattice constant of a cubic crystal of the silicon carbide is 4.36 Å, the lattice constant of the gallium nitride is 4.49 Å and the lattice constant of the silicon is 5.43 Å, and thus since a difference between the lattice constant of the silicon carbide and the lattice constant of the gallium nitride is smaller than a difference between the lattice constant of the silicon and the lattice constant of the gallium nitride, the stress between the two layers is small, and therefore, it is possible to reduce the dislocation density within the gallium nitride crystal sufficiently largely.

Further, since it is possible to form the first and the second gallium nitride crystals 3, 4 into film thicknesses which are sufficiently larger than that of the silicon carbide thin film 2, cleaving of the first and the second gallium nitride crystals 3, 4 at a cubic crystal {110} plane, for instance, is possible, and therefore, it is possible to realize a semiconductor laser apparatus in which the cleavage plane serves as an end surface of an oscillator.

Second Preferred Embodiment

FIGS. 2A to 2D are cross sectional views showing steps in sequence and describing a method of forming a gallium nitride crystal according to a second preferred embodiment of the present invention. In FIGS. 2A to 2D, denoted at 1 is a silicon substrate, denoted at 2 is a thin film of silicon carbide, and denoted at 5 is a gallium nitride crystal.

Figure 2:
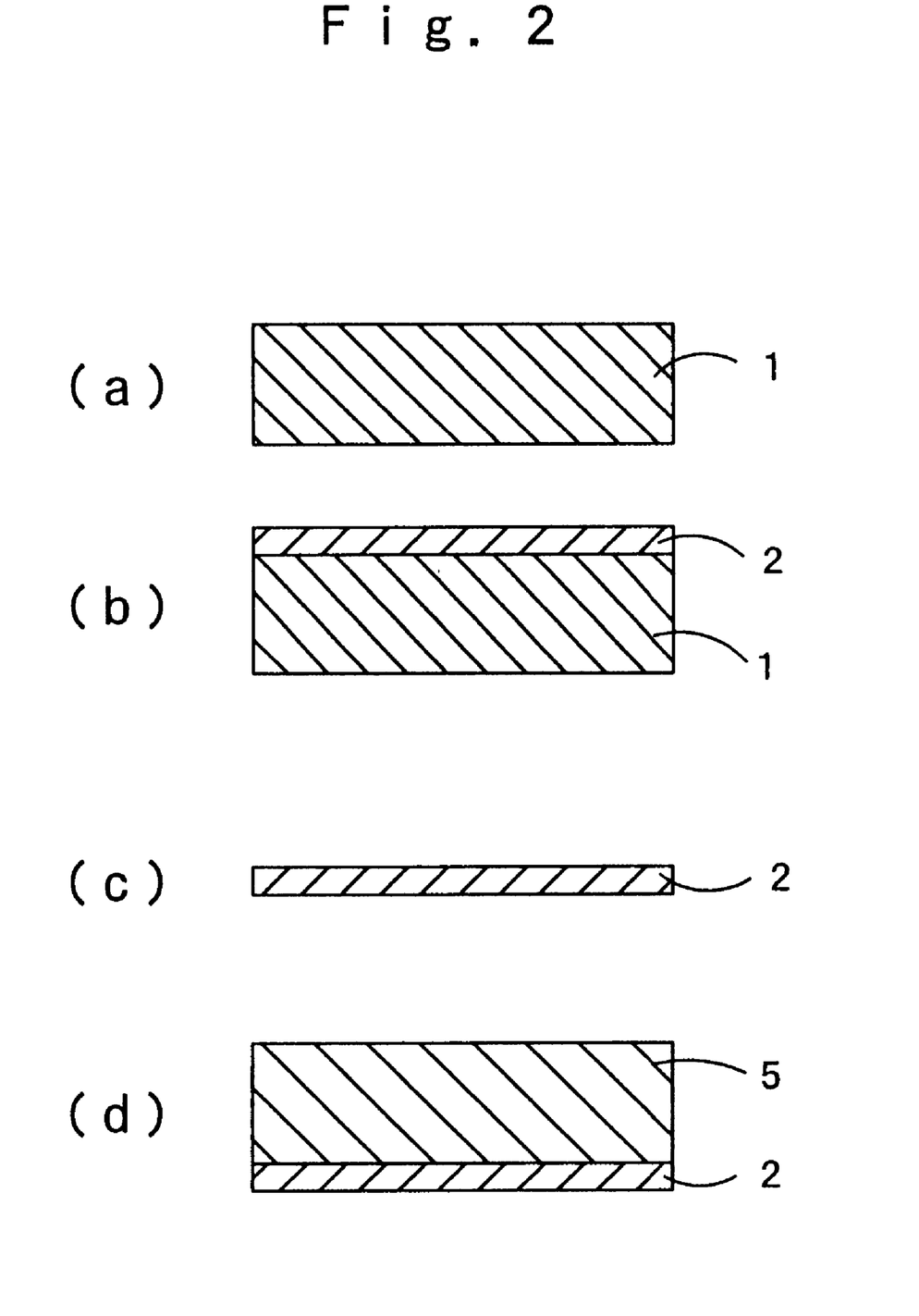
FIGS. 2A to 2D are cross sectional views showing steps in sequence and describing a method of forming a gallium nitride crystal according to a second preferred embodiment of the present invention.

In this method of forming a gallium nitride crystal, as shown in FIGS. 2A and 2B, the silicon carbide thin film 2 is formed into a thickness of about 5,000 Å on the silicon substrate 1. Following this, as shown in FIG. 2C, the silicon substrate 1 and the silicon carbide thin film 2 are immersed in an acid solution which is obtained by mixing HF and $HNO_3$, thereby removing only the silicon substrate 1. Further, as shown in FIG. 2D, the gallium nitride crystal 5 is formed into a thickness of about 30 $\mu$m on the silicon carbide thin film 2.

Thus, in the second preferred embodiment, by removing the silicon substrate 1, during growth of the gallium nitride crystal 5, crystal dislocations and cracks due to a stress between the two layers are created within the silicon carbide thin film 2 but not within the gallium nitride crystal 5, so that a dislocation density within the gallium nitride crystal is lowered. Further, since a difference between a lattice constant of the silicon carbide and a lattice constant of the gallium nitride is smaller than a difference between a lattice constant of the silicon and a lattice constant of the gallium nitride, the stress between the two layers is small, and therefore, it is possible to reduce the dislocation density within the gallium nitride crystal sufficiently largely.

Further, since it is possible to form the gallium nitride crystal 5 into a film thickness which is sufficiently larger than that of the silicon carbide thin film 2, cleaving of the gallium nitride crystal 5 at a cubic crystal {110} plane, for instance, is possible, and therefore, it is possible to realize a semiconductor laser apparatus in which the cleavage plane serves as an end surface of an oscillator.

Third Preferred Embodiment

FIGS. 3A to 3D are cross sectional views showing steps in sequence and describing a method of forming a gallium nitride crystal according to a third preferred embodiment of the present invention. In FIGS. 3A to 3D, denoted at 1 is a silicon substrate, denoted at 2 is a thin film of silicon carbide, and denoted at 5 is a gallium nitride crystal.

Figure 3:
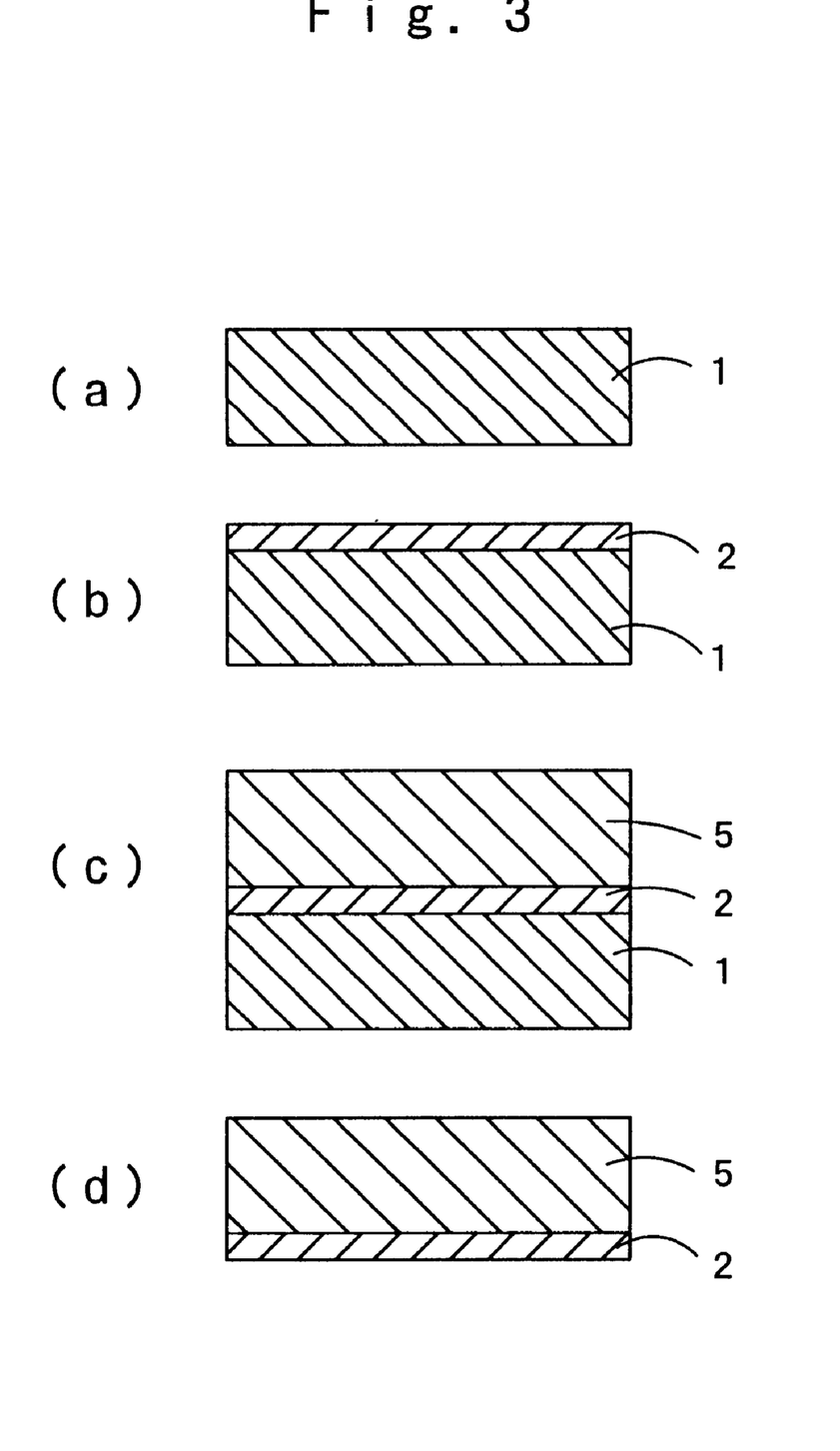
FIGS. 3A to 3D are cross sectional views showing steps in sequence and describing a method of forming a gallium nitride crystal according to a third preferred embodiment of the present invention.

In this method of forming a gallium nitride crystal, as shown in FIGS. 3A and 3B, the silicon carbide thin film 2 is formed into a thickness of about 500 Å on the silicon substrate 1. Following this, as shown in FIG. 3C, the gallium nitride crystal 5 is formed into a thickness of about 30 $\mu$m on the silicon carbide thin film 2. The silicon substrate 1, the silicon carbide thin film 2 and the gallium nitride crystal 5 are thereafter immersed in an acid solution which is obtained by mixing HF and $HNO_3$, thereby removing only the silicon substrate 1.

Thus, in the third preferred embodiment, by removing the silicon substrate 1, it is possible to form the gallium nitride crystal 5 into a film thickness which is sufficiently larger than that of the silicon carbide thin film 2, cleaving of the gallium nitride crystal 5 at a cubic crystal {110} plane, for instance, is possible.

Fourth Preferred Embodiment

A fourth preferred embodiment specifically describes a method of forming the silicon carbide thin film on the silicon substrate according to the first, the second and third preferred embodiments.

Figure 4:
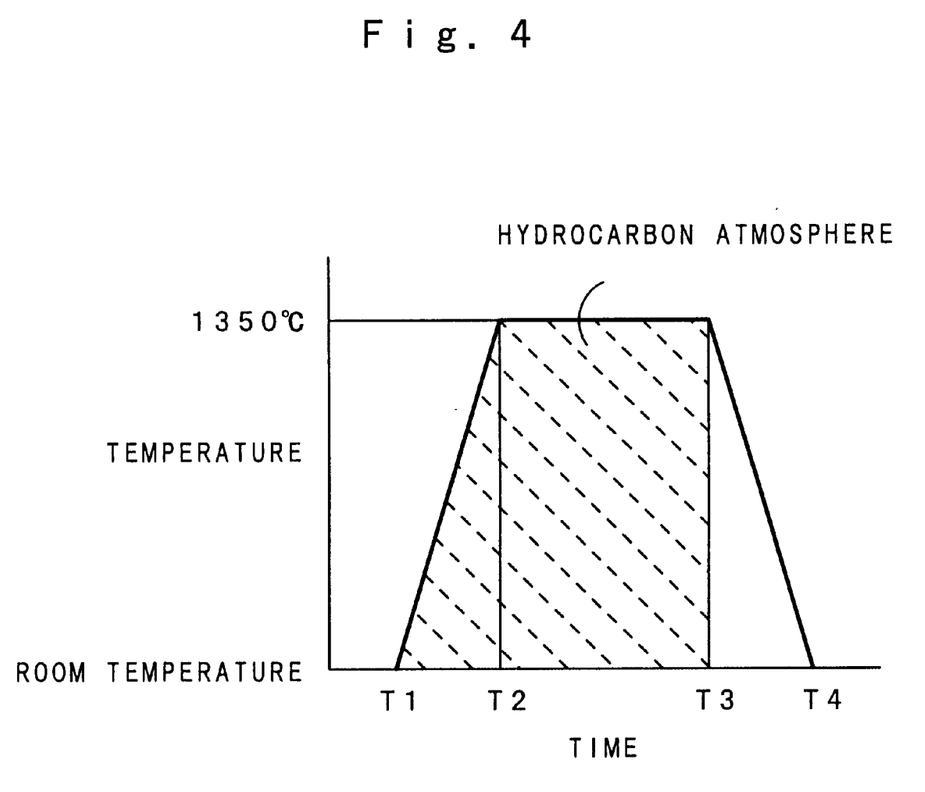
FIG. 4 is a time chart showing a temperature at which a thin film of silicon carbide is formed on a silicon substrate and a condition of supplied gas, in a method of forming a gallium nitride crystal according to a fourth preferred embodiment of the present invention.

FIG. 4 is a time chart showing a temperature at which the thin film of silicon carbide is formed on the silicon substrate and a condition of supplied gas, in the fourth preferred embodiment. FIG. 4 shows that from a time T1 to a time T2, the silicon substrate is heated from a room temperature to 1,350° C. in a hydrocarbon atmosphere such as $C_3H_8$, supply of silicon carbide is stopped after keeping a constant temperature from the time T2 to a time T3, and the temperature is reduced to the room temperature in an atmosphere of hydrogen, for instance, from the time T3 to a time T4.

In the fourth preferred embodiment, by heating the silicon substrate in a hydrocarbon atmosphere, it is possible to form a homogeneous silicon carbide thin film with an excellent reproducibility.

Although the fourth preferred embodiment requires use of a silicon substrate as a semiconductor substrate and a silicon carbide thin film as a semiconductor thin film, both the semiconductor substrate and the semiconductor thin film are not limited to silicon and silicon carbide, respectively. Rather, other materials may be used.

What is claimed is:

1. A method of forming a gallium nitride crystal, comprising forming a semiconductor thin film and a first gallium nitride crystal on a semiconductor substrate in that order, both said semiconductor thin film and said first gallium nitride crystal having a different lattice constant from a lattice constant of said semiconductor substrate, removing said semiconductor substrate, and thereafter forming a second gallium nitride crystal on said first gallium nitride crystal.

2. A method in accordance with claim 1, wherein a difference between said lattice constant of said first gallium nitride crystal and said lattice constant of said semiconductor thin film is less than a difference between said lattice constant of said semiconductor substrate and said lattice constant of said semiconductor thin film.

3. A method in accordance with claim 1, wherein said semiconductor substrate is removed by immersing said semiconductor substrate, said semiconductor thin film and said first gallium nitride crystal in an acid solution which removes only said semiconductor substrate.

4. A method in accordance with claim 1, wherein said semiconductor thin film is formed to a thickness of about 500 Å and said second gallium nitride crystal is formed to a thickness of about 30 μm on said first gallium nitride crystal.

5. A method of forming a gallium nitride crystal, comprising forming a semiconductor thin film on a semiconductor substrate, said semiconductor thin film having a different lattice constant from a lattice constant of said semiconductor substrate, removing said semiconductor substrate and thereafter forming a gallium nitride crystal on said semiconductor thin film.

6. A method in accordance with claim 5, wherein a difference between said lattice constant of said semiconductor thin film and said lattice constant of said gallium nitride crystal is less than a difference between said lattice constant of said semiconductor substrate and said lattice constant of said gallium nitride crystal.

7. A method in accordance with claim 5, wherein said semiconductor substrate is removed by immersing said semiconductor substrate and said semiconductor thin film in an acid solution which removes only said semiconductor substrate.

8. A method in accordance with claim 5, wherein said semiconductor thin film is formed to a thickness of about 5,000 Å and said gallium nitride crystal is formed to a thickness of about 30 μm on said semiconductor thin film.

9. A method of forming a gallium nitride crystal, comprising forming a semiconductor thin film and a gallium nitride crystal on a semiconductor substrate in that order, both said semiconductor thin film and said gallium nitride crystal having a different lattice constant from a lattice constant of said semiconductor substrate, and thereafter removing said semiconductor substrate.

10. A method in accordance with claim 9, wherein said semiconductor thin film is formed to a thickness of about 500 Å and said gallium nitride crystal is formed to a thickness of about 30 μm on said semiconductor thin film.

11. A method in accordance with claim 9, wherein said semiconductor substrate is removed by immersing said semiconductor substrate, said semiconductor thin film and said gallium nitride crystal in an acid solution which removes only said semiconductor substrate.

12. A method of forming a gallium nitride crystal, comprising forming a thin film of silicon carbide and a first gallium nitride crystal on a silicon substrate in that order, both said thin film and said first gallium nitride crystal having a different lattice constant from a lattice constant of said silicon substrate, removing said silicon substrate, and thereafter forming a second gallium nitride crystal on said first gallium nitride crystal.

13. A method of forming a gallium nitride crystal in accordance with claim 12, wherein said thin film of silicon carbide is formed by heating said silicon substrate in a hydrocarbon atmosphere.

14. A method in accordance with claim 13, wherein after said heating step, said silicon substrate and said silicon carbide thin film are cooled to room temperature in an atmosphere of hydrogen.

15. A method in accordance with claim 12, wherein a difference between said lattice constant of said first gallium nitride crystal and said lattice constant of said silicon carbide thin film is less than a difference between said lattice constant of said silicon substrate and said lattice constant of said first gallium nitride crystal.

16. A method in accordance with claim 12, wherein said silicon substrate is removed by immersing said silicon substrate, said silicon carbide thin film and said first gallium nitride crystal in an acid solution which is obtain by mixing hydrofluoric acid and nitric acid, thereby removing only said silicon substrate.

17. A method in accordance with claim 12, wherein said silicon carbide thin film is formed to a thickness of about 500 Å and said second gallium nitride crystal is formed to a thickness of about 30 μm on said first gallium nitride crystal.

18. A method of forming a gallium nitride crystal, comprising forming a thin film of silicon carbide on a silicon substrate, removing said silicon substrate and thereafter forming a gallium nitride crystal on said thin film of silicon carbide.

19. A method of forming a gallium nitride crystal in accordance with claim 18, wherein said thin film of silicon carbide is formed by heating said silicon substrate in a hydrocarbon atmosphere.

20. A method in accordance with claim 19, wherein after said heating step, said silicon substrate and said silicon carbide thin film are cooled to room temperature in an atmosphere of hydrogen.

21. A method in accordance with claim 18, wherein a difference between said lattice constant of said silicon carbide thin film and said gallium nitride crystal is less than a difference between said lattice constant of said silicon substrate and said gallium nitride crystal.

22. A method in accordance with claim 18, wherein said silicon substrate is removed by immersing said silicon substrate and said silicon carbide thin film in an acid solution which is obtain by mixing hydrofluoric acid and nitric acid, thereby removing only the silicon substrate.

23. A method in accordance with claim 18, wherein said thin film is formed to a thickness of about 5000 Å and said gallium nitride crystal is formed to a thickness of about 30 μm on said semiconductor thin film.

24. A method of forming a gallium nitride crystal, comprising forming a thin film of silicon carbide and a gallium nitride crystal on a silicon substrate in that order, and removing said silicon substrate.

25. A method of forming a gallium nitride crystal in accordance with claim 24, wherein said thin film of silicon carbide is formed by heating said silicon substrate in a hydrocarbon atmosphere.

26. A method in accordance with claim 25, wherein after said heating step, said silicon substrate and said silicon carbide thin film are cooled to room temperature in an atmosphere of hydrogen.

27. A method in accordance with claim 24, wherein said silicon carbide thin film is formed to a thickness of about 500 Å and said gallium nitride crystal is formed to a thickness of about 30 µm on said semiconductor thin film.

28. A method in accordance with claim 24, wherein said silicon substrate is removed by immersing said silicon substrate, said silicon carbide thin film and said gallium nitride crystal in an acid solution which is obtain by mixing hydrofluoric acid and nitric acid, thereby removing only said silicon substrate.

* * * * *